United States Patent
Lee et al.

(10) Patent No.: US 6,963,141 B2
(45) Date of Patent: Nov. 8, 2005

(54) SEMICONDUCTOR PACKAGE FOR EFFICIENT HEAT SPREADING

(76) Inventors: Jung-Yu Lee, 1F, No. 1, Kao Ping Tuan, Chung Feng Rd., Lung Tang Hsiang, Taoyuan Hsien (TW); Chung-Hsing Tzu, 1F, No. 1, Kao Ping Tuan, Chung Feng Rd., Lung Tang Hsiang, Taoyuan Hsien (TW)

(*) Notice: Subject to any disclaimer, the term of this patent is extended or adjusted under 35 U.S.C. 154(b) by 104 days.

(21) Appl. No.: 09/746,018

(22) Filed: Dec. 26, 2000

(65) Prior Publication Data
US 2001/0019181 A1 Sep. 6, 2001

(30) Foreign Application Priority Data
Dec. 31, 1999 (TW) .................................. 88123428 A

(51) Int. Cl.[7] .......................... H01L 23/28; H01L 23/10
(52) U.S. Cl. .................. 257/796; 257/675; 257/706; 257/712; 257/787
(58) Field of Search .................................. 257/796, 675, 257/730, 720, 787, 706, 707, 717–718, 722, 704, 719, 721, 731, 708–713

(56) References Cited

U.S. PATENT DOCUMENTS

| | | | |
|---|---|---|---|
| 5,108,955 A | * | 4/1992 | Ishida et al. |
| 5,609,315 A | * | 3/1997 | Lepore, Jr. |
| 6,146,921 A | * | 11/2000 | Barrow |
| 6,206,997 B1 | * | 3/2001 | Egitto et al. |

* cited by examiner

*Primary Examiner*—Long Pham
*Assistant Examiner*—DiLinh Nguyen
(74) *Attorney, Agent, or Firm*—Dickinson Wright PLLC

(57) ABSTRACT

The package of the present invention includes a chip located on a substrate with signal transferring device electrically connected between them. Solder balls connect the substrate and thus electrically connect the substrate to external circuits. Molding compound is covered to protect the chip and signal transferring means. The heat-slug is capped over the molding compound through a conductive glue. The entire area of the upper surface of the heat-slug is exposed to the ambient to improve the ability to spread heat.

11 Claims, 4 Drawing Sheets

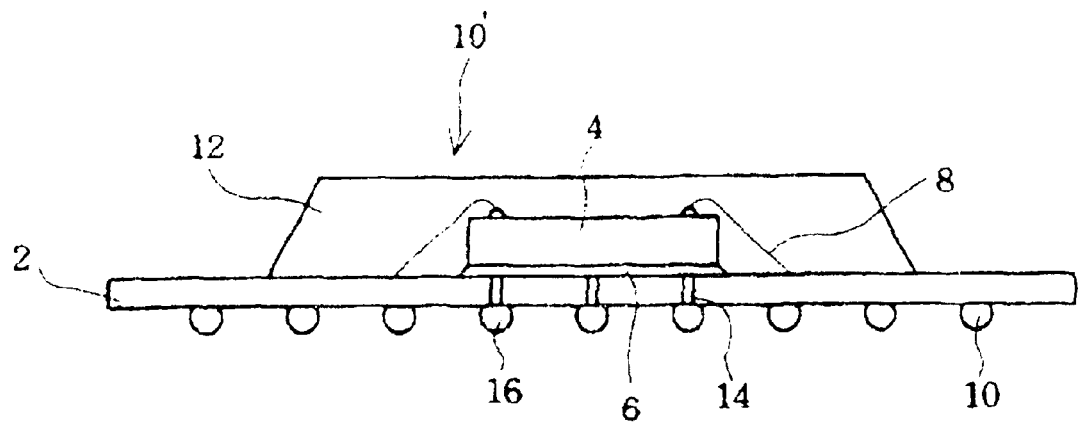
Fig. 1 PRIOR ART
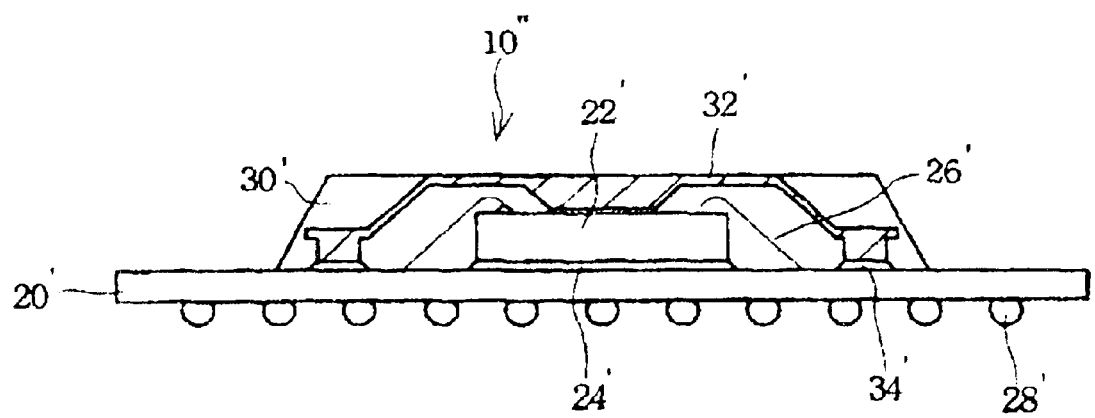
Fig. 2 PRIOR ART

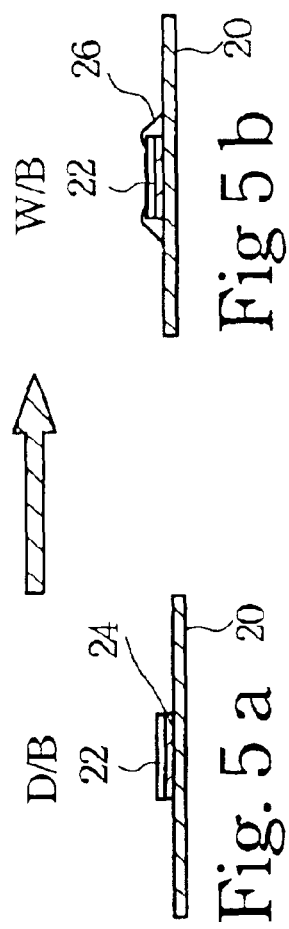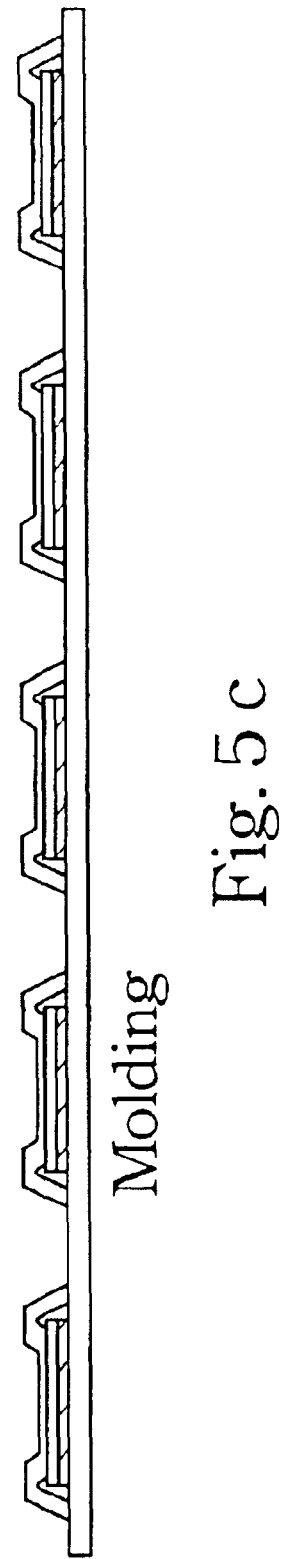

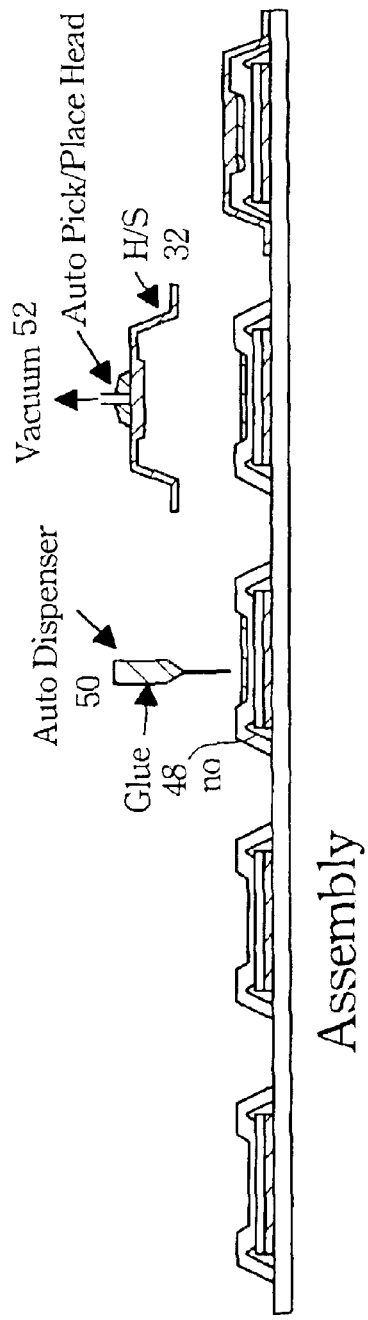
Fig. 5d  Assembly
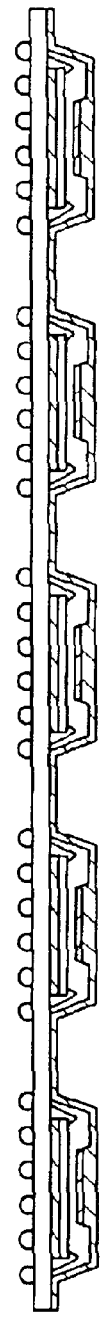
Fig. 5e  Ball Placement
Fig. 5f  Singulation

SEMICONDUCTOR PACKAGE FOR EFFICIENT HEAT SPREADING

FIELD OF THE INVENTION

The present invention relates to a semiconductor package, more particularly, to a semiconductor package which can improve the efficiency of spreading heat.

BACKGROUND OF THE INVENTION

In light of the trend to smaller and smaller-sized electronics devices, conventional discrete circuits are narrowly fabricated into a silicon-based or GaAs-based wafer using integrated circuits technology. The advent of the ULSI era in chip density has forced a radical upgrading of semiconductor processing technology. An integrated circuit chip itself is fragile and very tiny in dimension. There is a desire, for practical applications, to "wrap it up" thus isulating it from external force or environmental factors, which may cause the chip to be electrically or physically damaged. Meanwhile, it is needed to connect the chip to other external circuits to make the circuits combined with on-chip and off-chip circuits, forming a device to perform a specific function. This technology, "electronic packaging", puts these two needs into realization, which not only makes the chip properly located and well-connected to the external circuits, but also forms connections between the chip and external circuits.

Objectives of the IC chips packaging designs are not only to provide a substantial lead system, physical protection, environmental protection, but also to provide a heatsink for the chip.

For the present, electronic products have a trend to be becoming slighter and smaller. To satisfy the above requirements, integrated circuit technologies have been progressing in producing high-density, high-speed, high-capacity and light chips. The increasing power dissipation from on-chip circuits arouses an issue the IC is over-heated, which would make some electronic components walk off the range which they may always feature at normal temperature. Some components have changes in their properties, and some, even, get damaged perpetually. There is an expectation to deal with such a heat-spreading problem in packaging technology as the increase on speed of the current IC packages.

FIG. 1 shows a conventional package which includes a substrate 2, a die 4 formed on the substrate via die attach epoxy 6. The die is electrically connected to the substrate 2 through gold wire bonds 8. Solder balls 10 for signal transfer are formed on the bottom surface of the substrate 2. Molding compound 12 is used to cap the die 4 and gold wire bonds 8 for protection purpose. Heat from the die 4 is spread by using thermal vias 14 in the substrate 2 and thermal balls 16 connected to the thermal vias 14. However, the heat generated by components in the die is increased due to the increasing packaging density. This also causes the conventional package to fail to satisfy the future demands.

As the semiconductor production continuously grows, many structures of packages are suggested. Among them, a plastic molded package can be found, as described in U.S. Pat. No. 5,586,010. Another structure of package is disclosed in U.S. Pat. No. 5,629,835 to Mahulikar et al., entitled "METAL BALL GRID ARRAY PACKAGE WITH IMPROVED THERMAL CONDUCTIVITY".

For the present, conventional packages such as SOP and PQFP-type packages are not able to further increase the number of the lead frames around them. For the sake of more lead frames, the current packaging technology has turned to BGA-type packages. The BGA package is featurized by its spherical I/O-functioned leads, which are shorter, and hence operate with higher speed, and are not apt to become deformed. Therefore, the BGA packaging is well-suited for the future packaging topology. The spherical leads of the BGA are arranged as an array, but not circumferentially about the package as conventional lead frames are. Consequently, the BGA can readily increase the spherical balls on it. Coupled with the larger pitches, the BGA are a rather competitive candidate as considered a current and future packaging type.

Many proposals for an improved heat-spreader equipped BGA package are put forth. For example, kinds of heat slugs, heat sinks in any shape are attached to packages or packaging structures to improve the efficiency of spreading heat from packages.

FIG. 2 shows the package in the prior art 2. Two wings of the heat spreader 32' is fixed on the substrate 20' by a soft material, and thus the heat spreader 32' is well supported. Then the substrate 20' and the heat spreader 32' is sealed with molding compound 30' but the top side of the heat spreader 32' exposed. Actually, there are many holes (not shown) through the heat spreader 32', and molding compound 30' is driven into the heat spreader 32' therethrough. Unfortunately, there may be defects on the molding compound 30' (e.g., some air may be left in the molding compound) which would make the thermally conductive paths between the molding compound 30' and the heat spreader 32' discontinuous. The heat resistance between them is thus raised making the efficiency of heat spreading poor. Additionally, two wings of the heat spreader 32' are sealed within the molding compound 30' but only the top surface at the center of the heat spreader 32' is exposed to the ambient, which further worsens efficiency.

With the increase in speed of current and future integrated circuits, the current heat-spreading mechanisms are expected to be further improved. To settle the problem of heat spread in a package, the present invention suggests two structures with high-performance capability of spreading heat from a package, which are different from those in prior art as to their fabrication processes and structures.

SUMMARY OF THE INVENTION

It is an objective of the present invention to provide heat slug equipped packaging structures, which are able to sink more heat from a package as compared to those used in prior arts.

There are two structures proposed to enhance the efficiency of spreading heat in accordance with this invention. Different from the process used in the prior art of attaching a heat slug atop the substrate before molding process, the present process is to mold on the die to protect it and to proceed with heat slug attachment in this invention. By enlarging the area of the heat slug contacted with ambient air, the efficiency of spreading heat is apparently risen. However, in the prior art, large parts of the area of the heat sink embedded in the molding compound layer, and hence less area is contacted with the ambient. Obviously, the evidence tells that the proposed structures show better performance in reducing thermal resistance between the junctions of transistors in the chip and the ambient, and hence achieve improved heat sink equipped packaging structure.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a cross-sectional diagram of a heat sink equipped package in accordance with the prior art 1.

FIG. 2 is a cross-sectional diagram of a heat sink equipped package in accordance with the prior art 2.

FIG. 5a is a diagram representative of a die bonding process representative of the manufacturing process flow of the heat sink equipped package in the preferred embodiment of the present invention.

FIG. 5b is a diagram representative of a wire bonding process in the manufacturing process flow diagram of the heat sink equipped package in the preferred embodiment of the present invention.

FIG. 5c is a diagram representative of a molding process in the manufacturing process flow diagram of the heat sink equipped package in the preferred embodiment of the present invention.

FIG. 5d is a diagram representative of the assembly process of the heat-spreader in the manufacturing process flow of the heat sink equipped package in the preferred embodiment of the present invention.

FIG. 5e is a diagram representative of the ball placement process in the manufacturing process flow of the heat sink equipped package in the preferred embodiment of the present invention.

FIG. 5f is a diagram representative of a singulation process in the manufacturing process flow diagram of the heat sink equipped package in the preferred embodiment of the present invention.

DETAILED DESCRIPTION OF THE PREFERRED EMBODIMENT

The present invention discloses two packaging structures each equipped with a heat slug, and their manufacturing processes.

Figure 3:
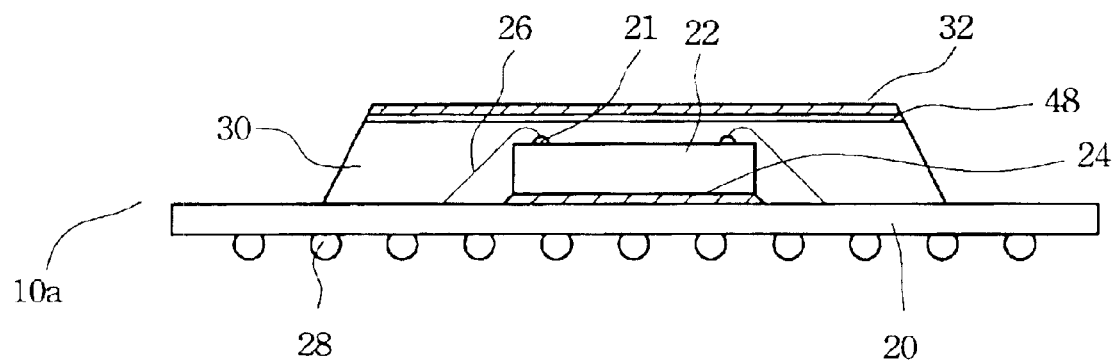
FIG. 3 is a cross-sectional diagram of the heat sink equipped package in the first embodiment in accordance with the present invention.

Turning to FIG. 3, the cross section view of the package in the first embodiment is illustrated. As shown therein, the package 10a includes a substrate 20. A semiconductor chip or die 22 is fixedly adhered to the substrate 20 by means of a die attaching material such as die attaching epoxy 24. The substrate 20 has a first major surface and a second major surface. The first major surface is referred to as the upper-sided surface of the substrate and the second major surface is referred to as the lower-sided surface of the substrate. The substrate 20 includes a plurality of conductive traces (not shown), such as flexible printed circuits formed therein. The conductive traces of the substrate 20 are used to provide electrical conductive paths for signal transfer. The material used for the substrate can be a dielectric material, for example, polyimide, phenolic resin or bismaleimidetriazine (BT). Of course, any other suitable materials can be used for the substrate. The conductive traces can be made of gold, copper or conductive metal or alloy.

Again referring to FIG. 3, the chip (die) 22 and the substrate 20 are interconnected by means of signal transferring means such as bonding wires 26, which can be, for example, gold wires. Actually, the die 22 is connected to the conductive traces of the substrate 20. Using conventional wire bonding or some other techniques, the chip 22 is coupled to the conductive traces. As aforesaid, the conductive traces are on the substrate for providing electrical connective paths. One end of the bonding wire 26 is connected to the chip 22 via a conductive pad formed thereon, the other end of the bonding wire 26 is connected to a solder ball of a BGA array 28 formed on the lower-sided surface (second major surface) of the substrate 20 via the conductive traces.

Molding compound 30 is covered on the die 22 to protect the die 22 and the signal transferring device 26. A thermally conductive material is layered on the top surface of the molding compound. The heat-spreading device is capped atop the thermally conductive material and the molding compound, wherein the thermally conductive material acts as a material for thermal transfer from the molding compound to the heat-spreading device. The heat-spreading device can be made of highly conductive material, such as copper, silver, metal, or metal alloy.

Ball grid array (BGA), preferably a solder bump array 28, is formed on the lower-sided surface of the substrate 20 by conventional positioning technique and using a solder re-flow operation. The solder bumps 28 are used for electrically coupling to the chip 22. It is appreciated that metal alloy can be used to act for the solder bumps 28. Typically, at an end of each conductive trace on the substrate 20 is connected to one of the solder bumps 28. Solder bumps 28 are terminals of the foregoing electrical conductive paths which permit electrical signals to transfer to the chip 22. In general, the solder bumps 28 are arranged in a matrix array configuration.

Figure 4:
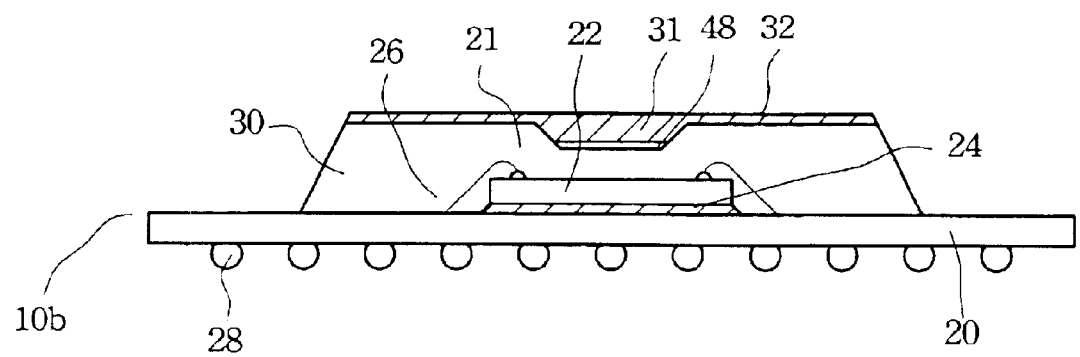
FIG. 4 is a cross-sectional diagram of the heat sink equipped package in the second embodiment of the present invention.

In the preferred embodiment of the invention shown in FIG. 4, there exists a downward bump 31 at the center of the heat slug which is geometrically different from the heat slug shown in FIG. 3. The compound 30 has a receessed portion to receive the downward bump 31. The bump 31 makes the heat slug near the top side of the die 22, and thus conducts heat from the die 22 more efficiently. It is noted that the bump 31 should not attach tightly to the die 22, but should have some spacing from the die 22 to prevent the die 22 from rubbing against the bump 31 caused by the different thermal expansion coefficient. A thermally conductive glue can be added between the bump 31 and the die 22. The glue also isolates the bump 31 with respect to the die 22.

Referring to FIGS. 5a–5f, which depict the manufacturing process of the structure in the second embodiment of the invention. The process starts with die bonding as shown in FIG. 5a, and is then succeeded by wire bonding as shown in FIG. 5b, molding as shown in FIG. 5c, and then by assembly of a heat-spreading device as shown in FIG. 5d. The assembly process begins with priming a thermally conductive glue 48 on the concave of the molding compound 30. Next the heat-spreading device 32 is fixed onto the molding compound 30 and the glue 48 by a vacuum pick head 52. The glue 48 acts as an intermediate layer for conducting heat from the die to the heat-spreading device, which then conducts heat away from the package to the ambient.

The prototype of the structure appears with the finishing of the assembly for the heat-spreading device. Then ball placement is undertaken to connect external circuits by implanting solder balls onto the conductive plate below the substrate as shown in FIG. 5e. Finally there is singulation to obtain individual packages from batches of packages in the manufacturing flow, which is shown in FIG. 5f. The method for formation of the structure in the first embodiment is similar to the method for formation of the structure in the second embodiment.

Finally, the comparison of thermal performances among the three packages is shown in Table 1. As set forth therein, 5.0W power is applied to the tree packages respectively with the ambient temperature of 22° C., and with their heat spreaders 32' made of aluminum and copper. The package in the prior art 2 shows a thermal resistance of 16.72° C./W, and 18.83° C./W for aluminum and copper-made heat spreader respectively. The package in the first embodiment is 16.53° C./W and 16.28° C./W. The package in the second embodiment is 15.71° C./W and 15.34° C./W. By data measured and shown above, the two packaging structures put forth in the present invention are obviously superior to the packaging structure used in the prior art 2.

TABLE 1

| Structure | Material for the heat-spreading device/ Parameters concerned | P | $\theta_{ja}$ | $T_j(° C.)$ |
|---|---|---|---|---|
| Prior Art 2 | Aluminum | 5.0 | 16.72 | 105.6 |
|  | Copper | 5.0 | 18.83 |  |
| The First | Aluminum | 5.0 | 16.53 | 104.65 |
| Embodiment | Copper | 5.0 | 16.28 | 103.38 |
| The Second | Aluminum | 5.0 | 15.71 | 100.56 |
| Embodiment | Copper | 5.0 | 15.34 | 98.69 |

As is understood by a person skilled in the art, the foregoing preferred embodiments of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structures.

What is claimed is:

1. A semiconductor package, comprising:
   a substrate;
   a die located and supported on said substrate with an adhesive layer between them;
   a plurality of signal transferring means which electrically connects said die to said substrate;
   a molding compound which seals and protect said die and said plurality of signal transferring means, wherein said molding compound has geometrically a recessed portion located at the top surface of the center part, wherein said die is located right below said recessed portion and fully covered by said molding compound, so that the thickness of said molding compound above said die is less than the thickness on the other portions of said molding compound; and
   a heat-spreading device which is attached atop said molding compound to conduct heat from said die to ambient air, wherein said heat-spreading device has a downward bump aligned to said recessed portion, and said molding compound exists between said downward bump and said die, said molding compound and said heat-spreading device being at least partially in surface-to-surface contact with one another;
   a thermally conductive adhesive applied between said molding compound and said heat-spreading device, wherein the thermally conductive adhesive is provided only between said substantially flat surface of said recessed portion of said molding means and substantially flat surface of said heat-spreading means, the remainder of said heat-spreading means contact areas and said molding means contact areas being in direct contact; and
   a plurality of conductive means attached below said substrate to electrically connect a plurality of conductive traces on said substrate to external circuits.

2. The semiconductor package of claim 1, wherein said plurality of conductive means includes a plurality of solder balls.

3. The semiconductor package of claim 1, wherein said plurality of signal transferring means can be a plurality of bonding wires.

4. The semiconductor package of claim 1, wherein said heat-spreading device can be made of metal.

5. The semiconductor package of claim 1, wherein said die has a thermally conductive glue, which conduct heat from said die through said molding compound to said heat-spreading device.

6. A semiconductor package, at least comprising:
   molding means having heat-spreading means contact areas, one of said contact areas being a recessed portion having a substantially flat surface located at the central part of the top surface, for sealing and protecting a die, which is adhered on a substrate by an adhesive layer and electrically connected to the substrate by a plurality of signal transferring means, wherein said die is located right below said recessed portion and fully covered by said molding means, so that the thickness of said molding means above said die is less than the thickness on the other portions of said molding means;
   heat-spreading means for conducting heat from said die to ambient air by attaching atop said molding means, said heat-spreading means having molding means contact areas, one of said molding means contact areas being a downward bump with a substantially flat surface aligned to said recessed portion, and said molding compound exists between said downward bump and said dies;
   an adhesive only between said substantially flat surface of said recessed portion of said molding means and said substantially flat surface of said heat-spreading means the remainder of said heat-spreading means contact areas and said molding means contact areas being in direct contact.

7. The semiconductor package of claim 6, further comprises a plurality of conductive means attached below said substrate to electrically connect a plurality of conductive traces on said substrate to external circuits.

8. The semiconductor package of claim 7, wherein said plurality of conductive means includes a plurality of solder balls.

9. The semiconductor package of claim 6, wherein said plurality of signal transferring means can be a plurality of bonding wires.

10. The semiconductor package of claim 6, wherein said heat-spreading means can be made of metal.

11. The semiconductor package of claim 6, wherein said die has a thermally conductive glue, which conduct heat from said die through said molding means to said heat-spreading device.

* * * * *